(12) United States Patent
Watanabe et al.

(10) Patent No.: US 8,013,315 B2
(45) Date of Patent: Sep. 6, 2011

(54) CHARGED PARTICLE BEAM APPARATUS, METHOD OF ADJUSTING ASTIGMATISM USING SAME AND METHOD OF MANUFACTURING DEVICE USING SAME

(75) Inventors: Kenji Watanabe, Tokyo (JP); Takeshi Murakami, Tokyo (JP); Ryo Tajima, Fujisawa (JP); Masahiro Hatakeyama, Tokyo (JP); Masatoshi Tsuneoka, Tokyo (JP); Nobuharu Noji, Tokyo (JP)

(73) Assignee: Ebara Corporation, Tokyo (JP)

( * ) Notice: Subject to any disclaimer, the term of this patent is extended or adjusted under 35 U.S.C. 154(b) by 789 days.

(21) Appl. No.: 11/898,358

(22) Filed: Sep. 11, 2007

(65) Prior Publication Data

US 2008/0099697 A1 May 1, 2008

(30) Foreign Application Priority Data

Sep. 12, 2006 (JP) ................................ 2006-246249
Oct. 10, 2006 (JP) ................................ 2006-276058

(51) Int. Cl.
*G21K 5/10* (2006.01)
(52) U.S. Cl. ................. 250/492.22; 250/492.3; 250/309
(58) Field of Classification Search .................. 250/306, 250/307, 309–311, 440.11, 441.11, 442.11, 250/492.2, 492.21, 492.22, 492.23, 492.3
See application file for complete search history.

(56) References Cited

U.S. PATENT DOCUMENTS

| | | | |
|---|---|---|---|
| 6,909,092 B2 | 6/2005 | Nagahama et al. | |
| 7,049,585 B2 * | 5/2006 | Nakasuji et al. | 250/310 |
| 7,109,484 B2 * | 9/2006 | Nakasuji et al. | 250/310 |
| 7,135,676 B2 * | 11/2006 | Nakasuji et al. | 250/310 |
| 7,138,629 B2 * | 11/2006 | Noji et al. | 250/311 |
| 7,297,949 B2 * | 11/2007 | Nakasuji et al. | 250/307 |
| 7,365,324 B2 * | 4/2008 | Noji et al. | 250/310 |
| 7,417,236 B2 * | 8/2008 | Nakasuji et al. | 250/440.11 |
| 7,592,586 B2 * | 9/2009 | Watanabe et al. | 250/251 |
| 2002/0036264 A1 * | 3/2002 | Nakasuji et al. | 250/306 |
| 2002/0047093 A1 * | 4/2002 | Son et al. | 250/307 |
| 2006/0151698 A1 | 7/2006 | Sasaki et al. | |
| 2008/0203298 A1 * | 8/2008 | Ishijima et al. | 250/307 |

FOREIGN PATENT DOCUMENTS

| | | |
|---|---|---|
| JP | 11-174008 A | 7/1999 |
| JP | 2000-188075 A | 7/2000 |
| JP | 2002-260568 A | 9/2002 |
| JP | 2005-174591 A | 6/2005 |
| JP | 2006-108123 A | 4/2006 |
| JP | 2006-173035 A | 6/2006 |

* cited by examiner

*Primary Examiner* — Bernard E Souw
(74) *Attorney, Agent, or Firm* — Westerman, Hattori, Daniels & Adrian, LLP (57) ABSTRACT

A charged particle beam apparatus 300 for observing and estimating a sample W by applying a charged particle beam to sample W to detect secondary charged particles, such as electrons emitted from the sample, reflected electrons and backscattered electrons comprises astigmatism adjusting means 17 for adjusting astigmatism of the charged particle beam. Astigmatism adjusting means 17 is supplied with a correction voltage which maximizes a focal estimation value obtained from a pattern formed on sample W. Astigmatism adjusting means 17 is a multipole including a plurality of pairs of electrodes or coils facing each other to place the optical axis of the charged particle beam at the center. Also disclosed is a charged particle beam apparatus 400 capable of observation and estimation of a sample surface in a condition where no charge up exists over the whole sample W.

28 Claims, 8 Drawing Sheets

CHARGED PARTICLE BEAM APPARATUS, METHOD OF ADJUSTING ASTIGMATISM USING SAME AND METHOD OF MANUFACTURING DEVICE USING SAME

BACKGROUND OF THE INVENTION

1. Technical Field

The present invention relates to a charged particle beam apparatus, a method of adjusting astigmatism using same and a method of manufacturing a semiconductor device using same for observing a surface of a sample with a high throughput at a high reliability to test and estimate the structure of a sample surface and an electric conductive condition (charged particle beam testing) by irradiating a surface of a sample with a charged particle beam, the sample being a wafer or a mask including patterns having a minimum line width of less than 0.1µ.

2. Background Technology

Japanese Patent Laid-open No. 2001-22986 describes an apparatus and method for observing and estimating a sample by irradiating the sample with an electron beam to detect secondary electrons, reflected electrons or backscattered electrons emitted from the sample. Japanese Patent Laid-open No. H05-258703 describes an electron apparatus wherein an electron beam is irradiated to a sample surface to detect secondary electrons emitted from the sample surface so as to combine an image from the detection results to obtain information about the sample surface.

In such a sample surface observing/estimating apparatus, the adjustment of astigmatism is essential to observe the surface at a high power. This is because an image is blurred as a result of an electron beam being deformed elliptically to either direction of rotation after the electron beam passes through an aperture, causing a longitudinal direction to deviate from a spot. In order to correct such a blurred image, it is necessary to apply an electric field or a magnetic field by a lens having eight to twelve or more poles to make the longitudinal direction of the electron beam narrower to form a spot-like electron beam. For example, Japanese Patent Laid-open No. H10-247466 describes a method of adjusting astigmatism using a magnetic field.

Figure 1A:
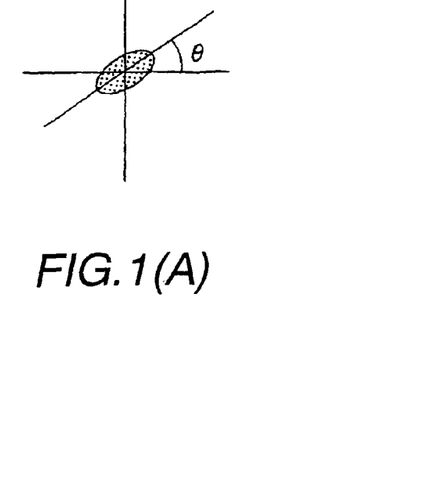
Figure 1B:
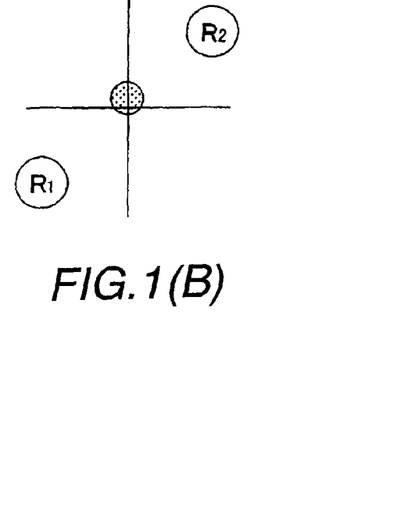
Figure 2:
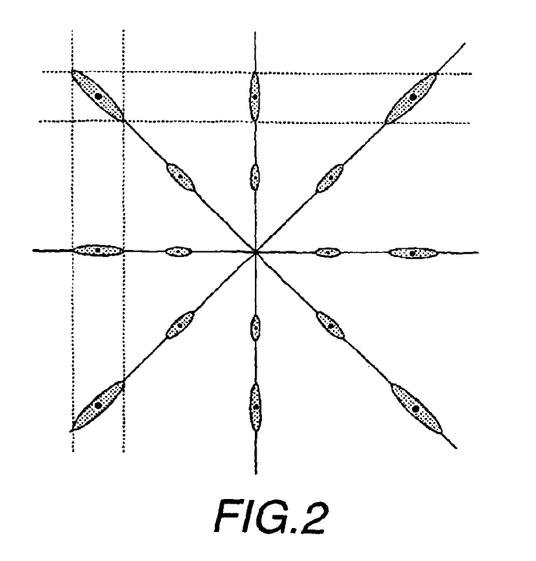
FIG. 2 is a schematic diagram for showing in what manner a sectional shape of a charged particle beam changes in accordance with an azimuth angle and a correction voltage.

More specifically, as shown in FIG. 1(A), if an electron beam is deformed elliptically and a cross section thereof on a sample surface is deformed to an elongated shape in a direction of azimuth angle θ, it is possible to adjust the cross section of the electron beam to be like a spot by assigning suitable voltages to a pair of facing electrodes $R_1$ and $R_2$ positioned in the direction of azimuth angle θ, as shown in FIG. 1(B). Consequently, if, as shown in FIG. 2, it is possible to set the longitudinal direction θ of the electron beam to 0°, 45°, 90°, 135°, 180°, 225°, 270° and 315°, it is possible to change, for example, an elliptically deformed cross section of the electron beam to a beam having a circle or a spot-like cross section, by disposing a pair of opposing electrodes on a line at any one of the above angles to optimize voltages to be applied to the pair of electrodes facing on the line which corresponds to the cross section to be adjusted.

In order to set azimuth angle θ and voltage V to be applied to the electrodes under optimum conditions, in the prior art, an applied voltage R has been adjusted such that a radial or ring-shaped pattern existing in a test pattern becomes sharp in all azimuth directions while observing the pattern. For example, Japanese Patent Laid-open No. H10-247466 discloses an SEM in which astigmatism is corrected by using a circular pattern.

However, a conventional algorithm for automatically adjusting astigmatism is disadvantageous because it is complex and difficult to understand. This is because it is impossible to extract an azimuth angle at which a pattern is blurred due to astigmatism, by using an autofocus function. Further, the test pattern must be observed previously when various wafers are finely adjusted. There is such a problem that astigmatism adjustment for every wafer is impossible if there is no test pattern on a wafer to be tested.

Figure 3:
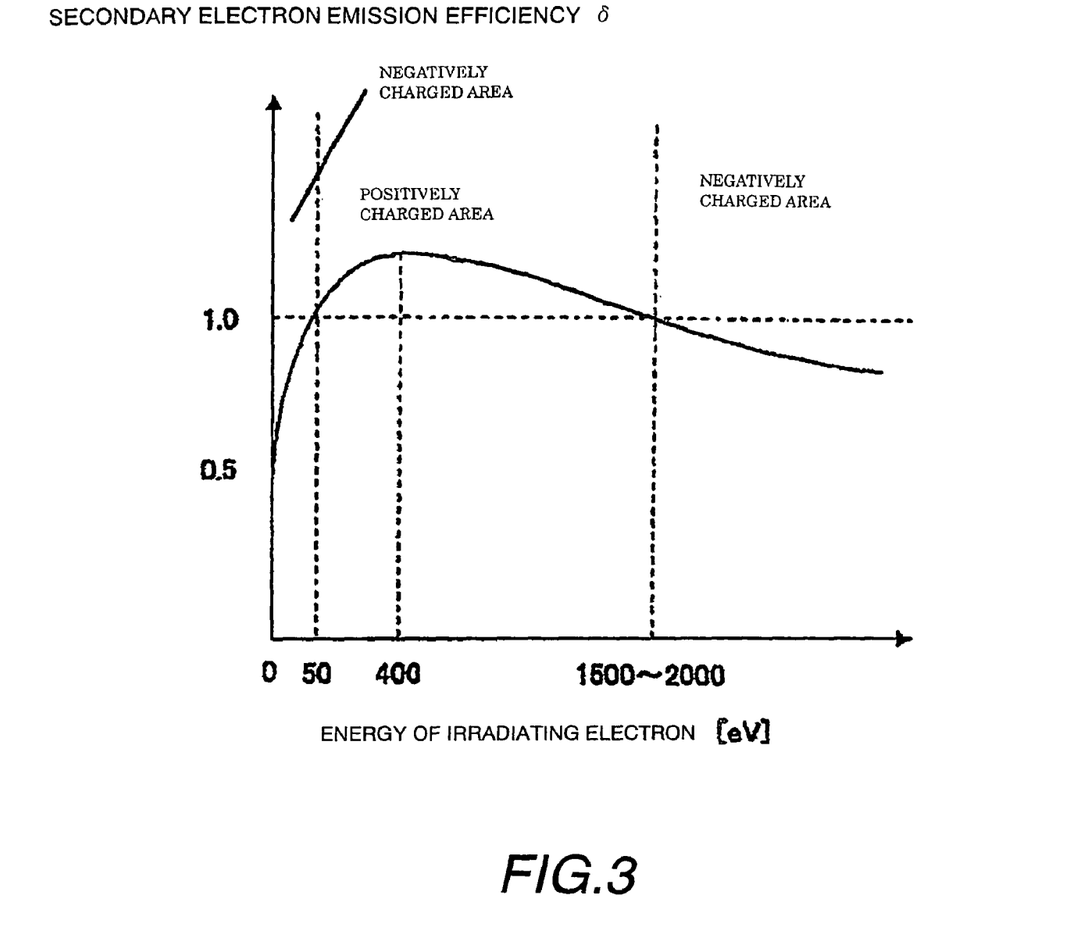
FIG. 3 is a graph showing a relationship between energy of an irradiating electron beam and an efficiency of emission a of secondary electrons when an electron beam is irradiated to an insulating material of $SiO_2$.

On the other hand, a relationship between primary electron beam irradiating energy and an efficiency of emission σ of secondary electrons is such as shown in FIG. 3. In a range where energy of irradiated primary electron beam is equal to or more than about 50 eV and equal to or less than 1500-2000 eV, efficiency of emission σ of secondary electrons is equal to or more than one, and more secondary electrons than an incident electron beam is emitted. As a result, a surface of an insulating material is charge up positively. However, if the primary electron beam energy is above or below the above-described range, efficiency of emission σ becomes equal to or less than one, and the surface of the insulating material is charged negatively. There is such a problem that, if positive or negative charge up becomes large, an image formed from the secondary electrons for observation and estimation begins to be distorted, resulting in failure in acquisition of accurate information about the sample surface.

Regarding the negative charge up, Japanese Patent Laid-open No. H10-275583 has proposed a method of neutralizing an electric charge on an sample surface, said method using capillary tubes and locally supplying a gas to an observation position on the sample to cause gas molecules to crash against the sample surface, thereby ionizing the gas molecules by combining the gas molecules with electrons by the crash. However, in a mapping-projection type electron apparatus which irradiates a wide area by an electron beam, it is impossible to supply a gas uniformly to the whole portions to be irradiated by the electron beam. Consequently, the above neutralizing method is not suitable to a mapping-projection type electron apparatus.

On the other hand, regarding the positive charge up, it is contemplated that electrons are irradiated to a sample from a filament-type electron source such as Tungsten to neutralize the charge up. In this case, there is such a problem that an insulating material tends to move from a positively charged condition to a negatively charged condition, thereby going to a further negatively charged condition, which makes a control difficult. A method of reducing charge up by supplying a gas uniformly to a surface of a sample has also been proposed. Usually, however, pressure on the surface of the sample has such a large value as 0.01-0.1 Pa, so aberration occurs when an electron beam is irradiated to the sample surface and an image for observation and estimation is blurred. Consequently, this method is not suitable to a sample having a line width less than 0.1µ. In addition, since the pressure within a chamber becomes as high as 0.001-0.1 Pa, there is such a problem that an inner surface of the chamber becomes dirty, resulting in the generation of discharge at portions to which a high voltage is applied.

Furthermore, Japanese Patent Laid-open No. 2003-331774 has proposed a method of reducing charge up by irradiating a sample surface by a laser beam. However, since the laser beam is required to have an irradiation intensity of about 10 W/cm$^2$, a great amount of energy is consumed and is not economical.

SUMMARY OF THE INVENTION

The present invention has been proposed to solve the above problems, and an object of the present invention is to provide a charged particle beam apparatus capable of astigmatism adjustment for every wafer without any need for previously preparing a test pattern for adjustment, and an astigmatism adjusting method using the apparatus. Another object of the present invention is to provide a charged particle beam apparatus capable of observation and estimation of a sample surface in a condition where no charge up exists over the whole sample, and a semiconductor device manufacturing method using the apparatus.

In order to solve the problems, the present invention provides a charged particle beam apparatus for observing and estimating a sample by irradiating the sample with a charged particle beam to detect secondary charged particles such as electrons emitted from the sample, reflected electrons and backscattered electrons, wherein the apparatus includes astigmatism adjusting means for adjusting astigmatism of the charged particle beam, and wherein the astigmatism adjusting means is supplied with a correction voltage which maximizes a value for adjusting focus obtained from an image of a pattern formed on the sample.

The astigmatism adjusting means preferably comprises a plurality of pairs of electrodes or coils opposing each other to place an optical axis of the charged particle beam at the center.

It is preferable that the astigmatism adjusting means has an electrode comprised of a multipole, that the electrode includes a first auxiliary electrode for adjusting a focus of longitudinal lines of a pattern formed on the sample and a second auxiliary electrode for adjusting a focus of lateral lines of the pattern formed on the sample, and that the astigmatism adjusting means operates to adjust a longitudinal line focus by adjusting a voltage of the first auxiliary electrode and adjusts a lateral line focus by adjusting a voltage of the second auxiliary electrode under a condition where a voltage applied when the longitudinal line focus has become the best is kept fixed.

It is preferable that the astigmatism adjusting means operates to supply a correction voltage which maximizes a value for adjusting focus obtained from an image of a second pattern having lines having a line width smaller than the lines of the pattern and that the astigmatism adjusting means operates to set an average value of the best focus in the longitudinal direction and the best focus in the lateral direction as an initial value for focus adjustment of the second pattern.

Further, in order to solve the problems above, the present invention provides a method of observing and estimating a sample by irradiating the sample with a charged particle beam to detect secondary charged particles such as electrons emitted from the sample, reflected electrons and backscattered electrons, the method characterized by the step of obtaining a correction voltage which maximizes a value for adjusting focus obtained from an image of a pattern formed on the sample to adjust astigmatism of the charged particle beam.

It is preferable that the pattern includes lines and spaces, the lines being wiring lines formed longitudinally and laterally on the sample.

The width of said lines is preferably 250 nm-45 nm.

Astigmatism is preferably adjusted using the lines or the spaces sequentially in a descending order of the size thereof.

It is preferable that values for adjusting focus for the lines and the spaces are obtained in two different directions and that a difference therebetween is used as an index to make the transition from one of the lines to the next line.

It is preferable that a longitudinal line focus is adjusted by adjusting a first auxiliary voltage for adjusting a focus of longitudinal lines of an image of a pattern formed on the sample and that a lateral line focus is adjusted by adjusting a second auxiliary voltage for adjusting the lateral line focus under a condition where a voltage applied when the longitudinal line focus becomes the best is kept fixed.

It is preferable that a correction voltage which maximizes a value for adjusting focus obtained from an image of a second pattern having lines having a line width smaller than the lines is obtained and that an average value of the best focus in the longitudinal direction and the best focus in the lateral direction is set as an initial value for focus adjustment in the longitudinal direction of the second pattern.

The above method is preferably automatically executed using an autofocus function. Further, the sample is preferably estimated in the midst of a process.

Further, in order to solve the problems above, the present invention provides a charged particle beam apparatus, comprising:

means for directing a primary charged particle beam to a sample for irradiation;

means for guiding, to a detector, secondary charged particles having information about a surface of the sample and obtained by the irradiation of the primary charged particle beam directed to the sample;

means for combining the secondary charged particles guided to the detector as an image, the apparatus characterized by further comprising:

measuring means for measuring an amount of charge on a surface of the sample; and charge eliminating means for reducing or eliminating the amount of charge on the surface of the sample on the basis of the amount of charge measured by the measurement means.

A current density of the primary charged particle beam is preferably set to be equal to or less than 10 A/cm$^2$.

Energy of the primary charged particle beam is preferably set to be equal to or more than 1 eV and less than 20 keV.

The measuring means preferably has means for measuring an electric potential of an area in the surface of the sample irradiated with the primary charged particle beam.

The charge eliminating means preferably comprises a light source for irradiating the sample and gas supplying means for supplying a gas to cover the surface of the sample uniformly.

It is preferable that the light source is either a laser source or a light source lamp and that a wavelength band of a laser beam from the laser source or incoherent light from the light source lamp is equal to or less than 300 nm-600 nm.

An irradiation density of the laser beam or the incoherent light is preferably equal to or more than 1 W/cm$^2$.

It is preferable that the apparatus comprises a stage for placing the sample thereon and that the gas supplying means includes a cover having at least one gas introduction part and covering the sample placed on the stage.

Gas pressure within a space covered by the cover is preferably 0.0001-0.1 Pa.

The gas is preferably either one of Nitrogen, water vapor, a halogenous gas having high electron affinity and a combination thereof.

The charge eliminating means preferably further comprises a mechanism for controlling an amount of gas supplied by the gas supplying means and the intensity of light emitted from the light source on the basis of the output of the measuring means.

The charge eliminating means preferably obtains an amount of charge Q[c] of the sample, using the equation Q=C×V on the basis of an electrostatic capacity C[F] between wiring lines of the sample and a surface potential[V] of the sample measured by the measuring means.

It is preferable that the charge eliminating means obtains an amount of charge Q[c] of the sample, using the equation Q=C×V on the basis of an electrostatic capacity C[F] between wiring lines of the sample and a surface potential[V] of the sample measured by the measuring means and that the charge eliminating means calculates an amount of the introduced gas on the basis of the amount of charge, the amount of molecules of the introduced gas, temperature, a probability of ionization of the introduced gas, an elementary charge, a time constant of charge up and differential discharge speed of the cover.

The charge eliminating means preferably calculates an intensity of the light source on the basis of the amount of charge, a probability of ionization of the introduced gas, an elementary charge and a first ionizing voltage of the introduced gas.

It is preferable to provide a semiconductor manufacturing method characterized by inspecting a wafer in the midst of processing, using the above-described charged particle beam apparatus.

Other objects and features of the present invention will become clear when reading the following description with reference to the accompanied drawings.

BRIEF DESCRIPTION OF THE DRAWINGS

FIGS. 1 (A) and 1(B) are schematic diagrams for explaining astigmatism adjustment;

DETAILED DESCRIPTION OF THE PREFERRED EMBODIMENT

Embodiments of a charged particle beam apparatus according to the present invention will be explained hereafter.

As those skilled in the art will appreciate, the embodiments explained hereafter are a mere illustration and do not limit the scope of the present invention. It is noted that similar reference numerals designate similar or like components in the drawings.

Figure 4:
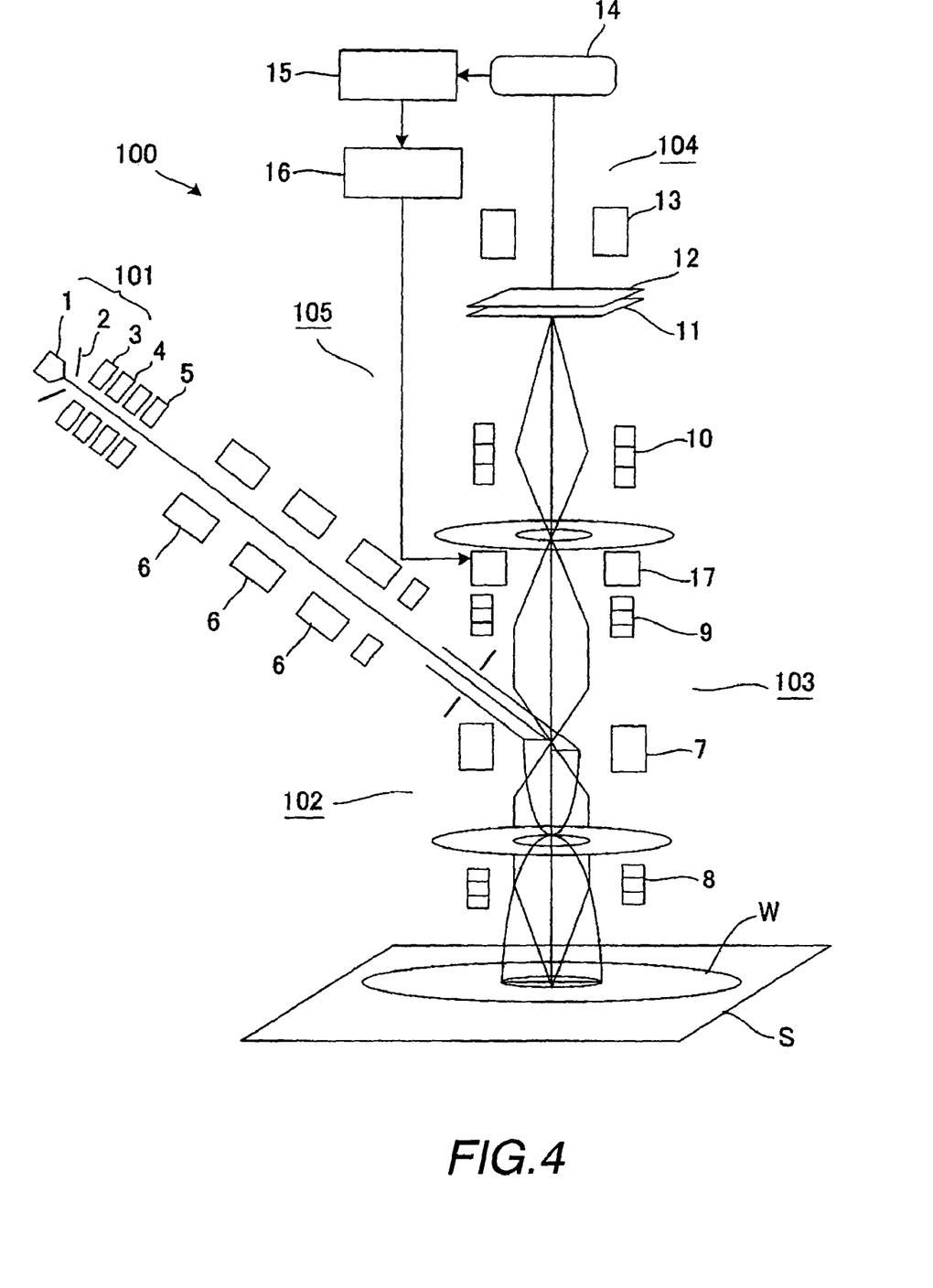
FIG. 4 is a diagram schematically showing the first embodiment of a charged particle beam apparatus according to the present invention.

FIG. 4 is a diagram schematically showing the structure of a mapping-projection type electron beam apparatus, which is the first embodiment of a charged particle beam apparatus according to the present invention. In this figure, an electron beam apparatus 100 comprises an electron beam emitting unit 101, a primary optical system 102, a secondary optical system 103, a secondary electron detecting unit 104 and an astigmatism adjusting unit 105. Electron bean emitting unit 101 comprises an electron gun 1, a Wehnelt electrode 2 and an anode 3. A primary electron beam, or a primary charged particle beam, emitted from electron gun 1 is accelerated by anode 3 and enters into primary optical system 102.

Primary optical system 102 comprises an electrostatic lens 4, a square aperture 5, a plurality of stages of a quadrupole lens 6, an E×B separator 7 and an objective lens 8. E×B separator 7 serves to change a traveling direction of the primary electron beam to cause the primary electron beam to travel to be perpendicular to a wafer W placed on an X-Y-θ stage S. Objective lens 8 forms a desired sectional shape of the primary electron beam which in turn irradiates wafer W. X-Y-θ stage S is supported to be movable in two orthogonal directions X and Y and to be able to rotate about any one of those directions, thereby causing the primary electron beam to scan a surface of wafer W.

A secondary electron beam, or a secondary charged particle beam, emitted from wafer W by the irradiation of the electron beam and including reflected electrons and backscattered electrons passes through secondary optical system 103 and enters into secondary electron detecting unit 104. Secondary optical system 103 comprises objective lens 8, E×B separator 7, a first-stage capacitor lens 9 and a second-stage capacitor lens 10. Secondary electron detecting unit 104 comprises a fluorescent screen 11, a TDI 12, an MCP 13, a detector 14 and an image process unit 15. Fluorescent screen 11 converts incident secondary electrons to an optical signal, which is in turn converted to an electric signal by TDI 12 and transmitted to detector 14. Detector 14 produces an electric signal corresponding to the intensity of the received secondary electrons and sends the electric signal to image process unit 15. Image process unit 15 performs an analog-to-digital conversion of the received electric signal to form a digital image signal. Those operations are performed throughout a scan period of wafer W and, as a result, image process unit 15 can output an image of wafer W.

Astigmatism adjusting unit 105 comprises an astigmatism controller 16 and an astigmatism adjuster 17. The output of image process unit 15 is supplied to astigmatism controller 16. Astigmatism adjuster 17 is a multipole comprising a plurality of pairs (for example, two or more pairs) of electrodes or coils placing the optical axis of secondary optical system 106 at the center and opposing each other on a surface perpendicular to the optical axis of secondary optical system 103. A larger number of electrodes or coils can increase the accuracy of the astigmatism adjustment.

Figure 5:
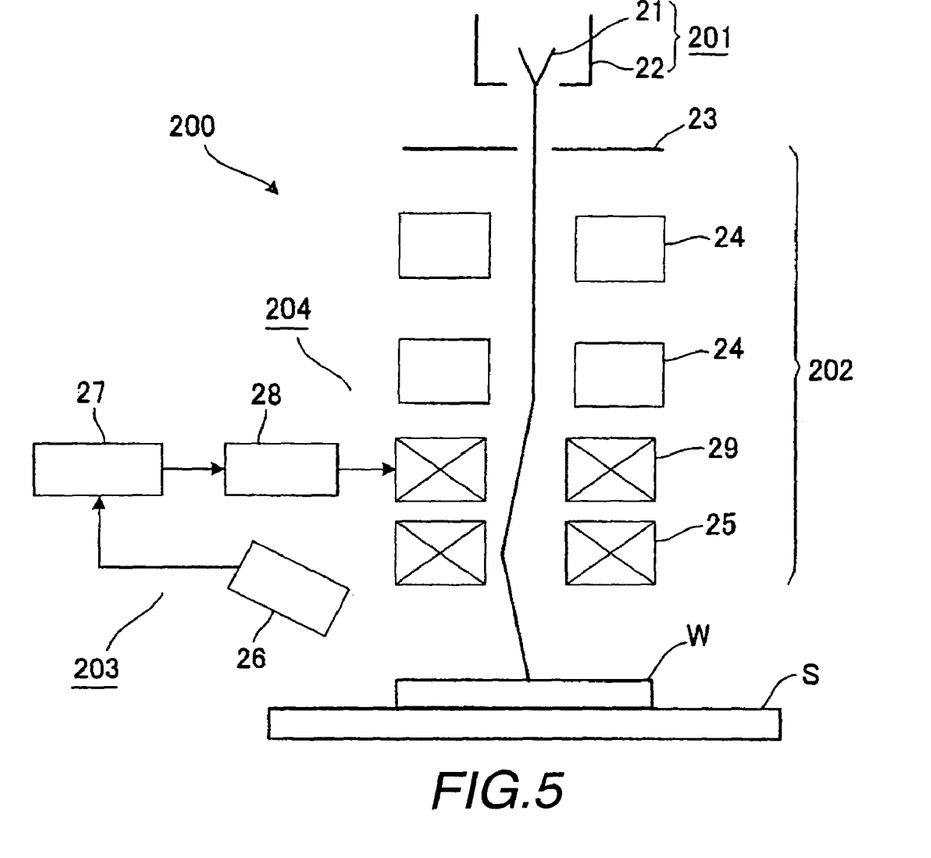
FIG. 5 is a diagram schematically showing the second embodiment of a charged particle beam apparatus according to the present invention.

FIG. 5 is a diagram schematically showing a scan-type electron apparatus, which is the second embodiment of a charged particle beam apparatus according to the present invention. In this figure, an electron apparatus 200 comprises an electron beam emitting unit 201, an electro-optical system 202, a secondary electron detecting unit 203 and an astigmatism adjusting unit 204. Electron beam emitting unit 201 comprises an electron source 21 and a Wehnelt electrode 22.

A primary electron beam, or primary charged particle beam, emitted from electron source 21 passes through Wehnelt electrode 22 and enters into electro-optical system 202.

Electro-optical system 202 comprises a square aperture 23, a plurality of stages of quadrupole lenses 24 and a scanning coil 25. By adjusting a voltage applied to scanning coil 25, the direction of travel of the electron beam emitted from electron source 21 is changed to cause the electron beam to be incident to wafer W placed on X-Y-θ-stage S. X-Y-θ-stage S is supported to be movable in two orthogonal directions and rotatable about either one of the two orthogonal directions, thereby causing the primary electron beam to scan the surface of wafer W.

A secondary electron beam, or a secondary charged particle beam, emitted from wafer W by the irradiation of the primary electron beam and including reflected electrons and backscattered electrons are incident to secondary electron detecting unit 203. Secondary electron detecting unit 203 comprises a detector 26 for receiving secondary electrons emitted from wafer W to convert the secondary electrons to an electric signal corresponding to the intensity of the secondary electrons, and an image process unit 27 for processing the electric signal received form detector 26 for forming an image thereof. Detector 26 generates an electric signal corresponding to the intensity of the received secondary electrons and supplies the signal to image process unit 27, which in turn makes an analog-to-digital conversion of the received electrical signal to form a digital image signal. Those operations are performed throughout a scan period of wafer W, and, as a result, image process unit 27 can output an image of wafer W.

Astigmatism adjusting unit 204 comprises an astigmatism controller 28 and an astigmatism adjuster 29. The output of image process unit 27 is supplied to astigmatism controller 28. Astigmatism adjuster 29 is a multipole comprising a plurality of pairs (for example, two or more pairs) of electrodes or coils placing the optical axis of secondary optical system 202 at the center and opposing each other on a surface perpendicular to the optical axis of secondary optical system 202.

Figure 6A:
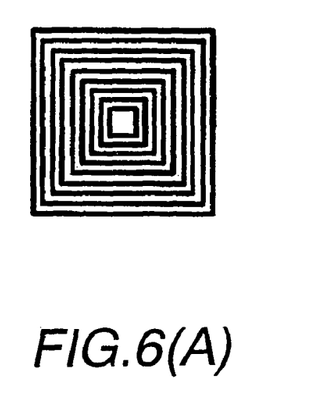
FIG. 6(A) shows an example of a box pattern.
Figure 6B:
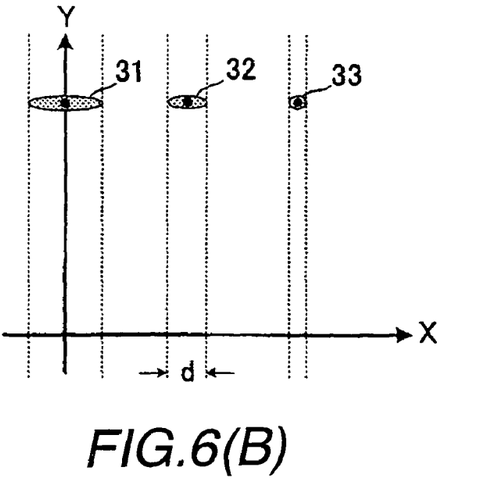
FIG. 6(B) is a schematic diagram showing in what matter a sectional shape which has been extended in one direction changes with a correction voltage when astigmatism adjustment has been made.

In order to carry out astigmatism adjustment in an electron beam apparatus as shown in FIGS. 4 and 5, the present invention utilizes a pattern having lines and spaces running in two orthogonal directions and selected from the wiring patterns formed on wafer W so as to be able to simultaneously observe lines running vertically and horizontally. An example of the pattern is a box pattern having lines and spaces the width of which is 180 nm, as shown in FIG. 6(A). By irradiating such a pattern with an electron beam, a digital image of the pattern is obtained from image process unit 15 and 27. As a result, if a digital image indicating that a sectional shape of the electron beam is an ellipse 31 having the major axis in the direction of X axis, as shown in FIG. 6(B), is outputted, a pair of electrodes or coils of astigmatism adjuster 17, 29 located on the X axis is applied with a correction voltage having an appropriate magnitude to make astigmatism adjustment of the electron beam. As a result, the sectional shape of the electron beam can be adjusted to a circle 33 through an ellipse 32 having a shorter major axis than ellipse 31. It is noted that a width "d" represents the degree of sharpness of a pattern in the direction of Y axis.

Similarly, if a digital image indicating that a sectional shape of the electron beam is an ellipse having the major axis in the direction of Y axis perpendicular to the X axis is outputted, a pair of electrodes or coils of the astigmatism adjuster located on the Y axis is applied with an appropriate correction voltage to make the sectional shape circular.

Figure 7:
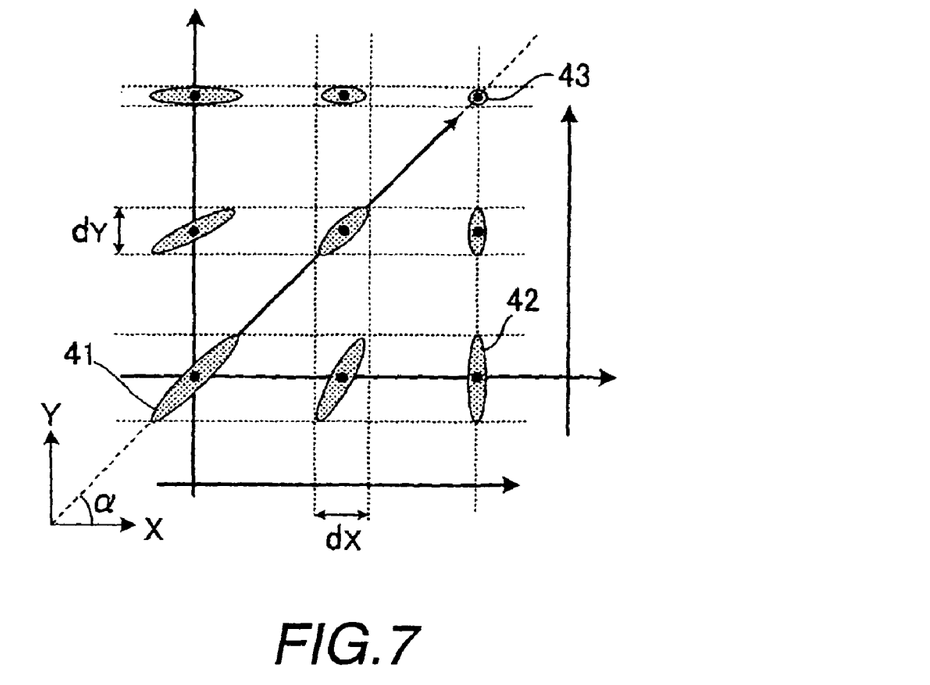
FIG. 7 is a diagram showing a sectional shape of an electron beam in general.

In practice, a sectional shape of the electron beam does not change in the direction of one axis only, that is, in the direction of X axis or Y axis. It is general that the sectional shape is changed to an ellipse 41 which inclines in the direction of an azimuth angle α, as shown in FIG. 7, for example. Then, in the electron beam apparatus shown in FIGS. 4 and 5, astigmatism adjustment in the direction of X axis is carried out, using astigmatism adjuster 17, 29, to the electron beam having the sectional shape of ellipse 41, while observing an image outputted from image process unit 15, 27, to adjust the sectional shape of the electron beam to be ellipse 42 having the major axis in the direction of Y axis. By doing this, the resolution in the direction of Y axis can be improved. Then, astigmatism adjustment is carried out to the electron beam having the sectional shape of ellipse 42 to cause the sectional shape to be a circle 43. By doing this, an ideal round beam can be obtained from the electron beam and the astigmatism adjustment to the electron beam is completed. In FIG. 7, the width $d_X$ in the direction of X axis represents the degree of sharpness of a line in the direction of Y axis and the width $d_Y$ in the direction of Y axis represents the degree of sharpness of a line in the direction of X axis.

It is noted that the explanation has been made in the above to carry out astigmatism adjustment in the direction of X axis before carrying out astigmatism adjustment in the direction of Y axis, but, reversely, the sectional shape of the electron beam can be changed to circle 43 by carrying out astigmatism adjustment in the direction of Y axis before carrying out astigmatism adjustment in the direction of X axis.

In order to carry out astigmatism adjustment, using the above-described process, to an electron beam having a sectional shape of ellipse 41 as shown in FIG. 7, the following steps are performed. In the explanation below, it should be noted that correction of the shape of an electron beam in the direction of X axis makes longitudinal lines in a photographed pattern clear and correction of the shape of an electron beam in the direction of Y axis makes lateral lines in a photographed pattern clear.

(1) An electron beam is irradiated to a wafer including a pattern having relatively wide lines and spaces (for example, the line width is 180 nm), and a static image thereof is obtained at predetermined resolution;

(2) The process moves to a box pattern (for example, a box pattern having lines and spaces having a certain amount of width as shown in FIG. 6(A)) in the obtained image having lines running vertically and horizontally or perpendicular to each other;

(3) Using an autofocus function of the electron beam apparatus, a value for adjusting focus, Fv, is obtained from the box pattern of interest when the longitudinal lines can be seen clearly. Specifically, a correction voltage $V_X$ for correcting longitudinal astigmatism is applied to the multipole of astigmatism adjuster 28 and a value for adjusting focus, Fv1, is obtained when the longitudinal lines can be seen clearly;

(4) Then, a focal value for adjusting focus, Fh, is obtained when lateral lines can be seen clearly. Specifically, a correction voltage $V_Y$ for correcting lateral astigmatism is applied to the multipole of astigmatism adjuster 28 and a value for adjusting focus, Fh1, is obtained when the lateral lines can be seen clearly, while fixing $V_{X1}$, a correction voltage when Fv1. If the shape of the irradiating beam is circular, Fv1 and Fh1 should coincide with each other. However, since the line width of the observed object is relatively large, such as 180 nm, it is contemplated that such an order has distorted the beam shape. Then, in the next step, an image of a pattern having a smaller line width is obtained and astigmatism of the electron beam is corrected on the basis of the obtained image;

(5) The electron beam is irradiated to a wafer having smaller line and space widths (for example, line width of 150 nm) and a static image thereof is obtained at predetermined resolution;

(6) The process moves to a box pattern having lines running vertically and horizontally;

(7) Using the autofocus function of the electron beam apparatus, a value for adjusting focus, Fv, is obtained from the box pattern of interest when the longitudinal lines can be seen clearly. As described above, Fv1 and Fh1 should coincide with each other if the irradiating beam shape is circular, so a value for adjusting focus to be obtained is thought to exist between Fv1 and Fh1. Consequently, at this stage, correction voltage $V_X$ is applied having an average value of Fv1 and Fh1, Fo=(Fv1+Fh1)/2, as an initial value, to obtain the best longitudinal value for adjusting focus, Fv2; and (8) Then, lateral adjustment is made. A correction voltage $V_Y$ for correcting lateral astigmatism is applied to the multipole of astigmatism adjuster 28 and a value for adjusting focus, Fh2, is obtained when the lateral lines can be seen clearly, while fixing $V_{X2}$, a correction voltage in the direction of X axis when Fv2.

Hereafter, processes (5)-(8) are repeated for a box pattern having a smaller line width (of, for example, 130 nm) and the astigmatism of the electron beam is corrected. This process is repeated, taking a line width of an actual tested object into account.

It is noted that a quadrupole is used for correcting electrodes in this embodiment as multipole of astigmatism adjuster 28. In the case of octupole or dodecrupole, however, since it is possible to make such correction in the directions of multiple axes, as well as in two orthogonal axes, X and Y axes, there may be a case where the electron beam shape can be corrected to be substantially circular by means of only one box pattern.

Figure 8:
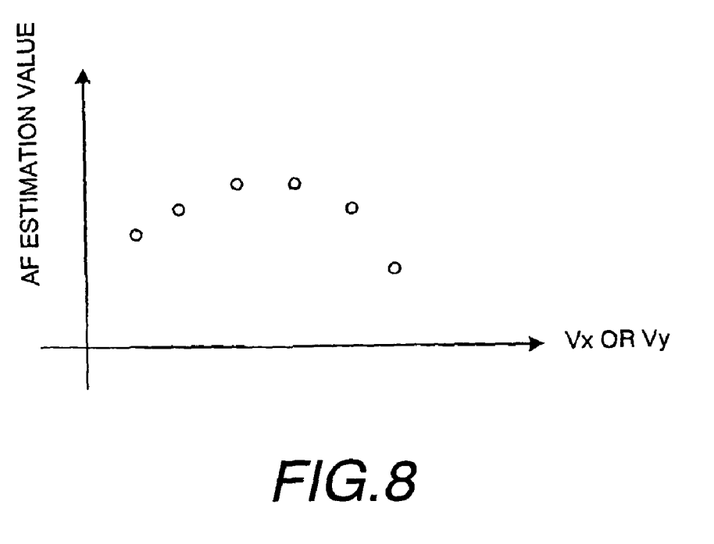
FIG. 8 is a graph showing a correlation between a correction voltage in a charged particle beam apparatus and an automatic focus estimation value.

Generally, a difference $\Delta F$ (=Fv1−Fh1) has a certain value if astigmatism adjustment is insufficient. Difference $\Delta F$ is reduced and pattern resolution in the directions of X and Y axes comes up, as the astigmatism adjustment proceeds. FIG. 8 shows a correlation between the magnitude of correction voltage $V_X$ or $V_Y$ and an autofocus estimation value Fh or Fv. From the drawing, it can be seen that the autofocus value becomes maximum at a certain value of the correction voltage.

Figure 9:
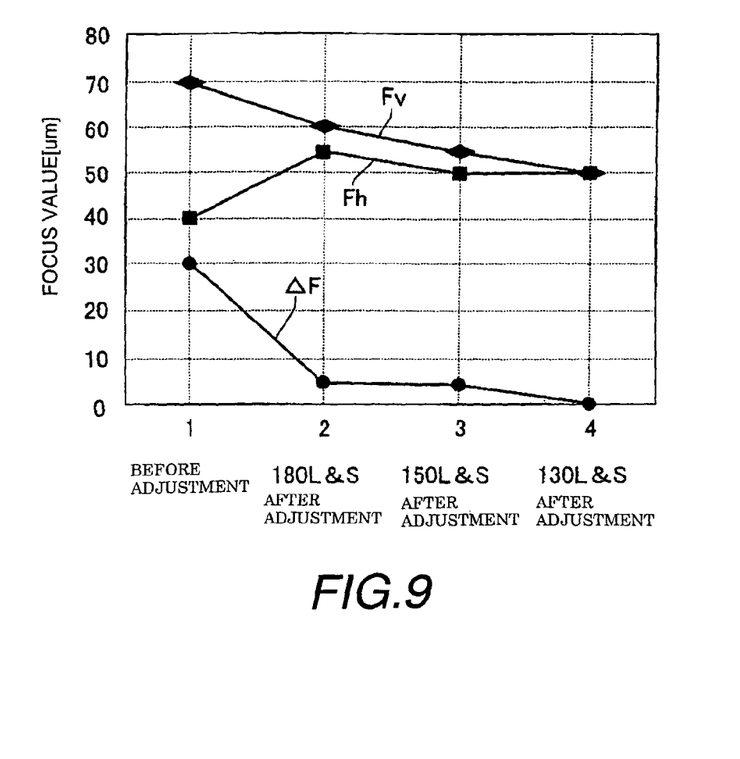
FIG. 9 is graphs showing relations between a line width of a pattern and a focal value for adjusting focus at the time of astigmatism adjustment conducted by using the charged particle beam apparatus shown in FIGS. 4 and 5.

FIG. 9 shows, as an example, transitions in Fv and Fh when astigmatism adjustment is carried out in sequence in accordance with the above steps, utilizing the autofocus function and using box patterns having line and space widths of 180 nm, 150 nm and 130 nm. In FIG. 9, the term "180L&S after adjustment" shows a state after the astigmatism adjustment for the box pattern having line and space widths of 180 nm is completed. The terms "150L&S after adjustment" and "130L&S after adjustment" have a similar meaning. As shown in FIG. 9, difference $\Delta F$ between Fv1 and Fh1 becomes smaller every time the astigmatism adjustment is carried out using a box pattern having a smaller line width, and difference $\Delta F$ becomes to zero and excellent resolution can be obtained in both X and Y directions, after the completion of the astigmatism adjustment for the box pattern having the line width of 130 nm.

Figure 10:
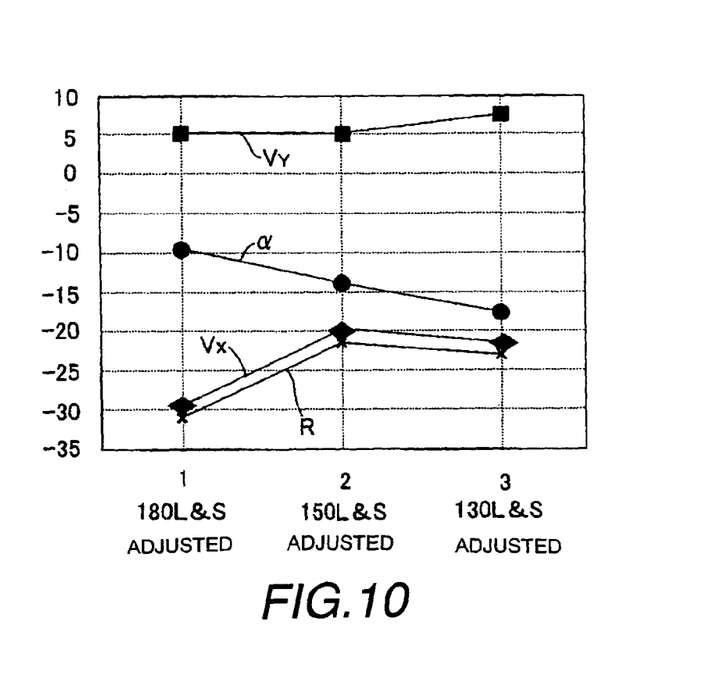
FIG. 10 is graphs showing an azimuth angle and a correction voltage used at the time of astigmatism adjustment.

FIG. 10 shows $V_X$ and $V_Y$ in each box pattern when the adjustment referred to in FIG. 9 is made. It is noted that $\alpha=\tan^{-1}(V_Y/V_X)$ and R is an intensity. In FIG. 10, the unit of $V_X$ and $V_Y$ is volt and the unit of $\alpha$ is degree. Only about twenty seconds was required to complete the astigmatism adjustment using the above box patterns having three different line widths.

As will be seen from the above, in the first and second embodiments of the present invention, an optimum correction voltage for astigmatism adjustment is obtained using autofocus values of an image obtained from a pattern formed on a sample. Consequently, such an advantage can be brought about that astigmatism adjustment can be completed more quickly with an algorithm simpler than a conventional one.

Next, the structure and operation of the third embodiment of a charged particle beam apparatus according to the present invention will be explained using FIG. 11. The charged particle beam apparatus shown is embodied to a mapping-projection type charged particle beam apparatus 300. This mapping-projection type charged particle beam apparatus has a stage S movable in the directions of three orthogonal axes and rotatable about one axis. A sample W (for example, an 8-12 inch silicon wafer on which circuit patterns in the midst of LSI manufacturing are formed) is disposed on stage S. In order to irradiate sample W with a primary electron beam (primary charged particle beam), there is provided a primary electro-optical system 302 comprising a particle beam emitting unit 301 having a cathode 31, a Wehnelt electrode 32 and an anode 33, a plurality of stages of electrostatic lenses 34, an aperture 35 and a beam splitter 36 such as EB filter. A primary charged particle beam emitted from cathode 31 irradiates sample W through primary electro-optical system 302 comprising Wehnelt electrode 32, anode 33, electrostatic lenses 34, aperture 35 and beam splitter 36. Secondary charged particles (including secondary electrons, backscattered electrons and reflected electrons) emitted from the surface of sample W is magnified by the magnification of 50-1000 by electrostatic lenses 37, 38 and 39 forming a secondary electro-optical system 303 and is focused on a detection system 304.

Detection system 304 comprises a microchannel plate (MCP) 40, a fluorescence screen 41 and a TDI (Time Delayed Integration) 42. The secondary charged particles is multiplied by MCP 40 and is converted to a two-dimensional optical signal by fluorescence screen 41. The two-dimensional optical signal is directed to TDI 42 and is detected as an image. Sample W placed on stage S is continuously moved with continuous upward, downward, leftward and rightward movement of stage S and a two-dimensional image signal can be obtained by TDI 42 at high speed. An image signal outputted from TDI 42 is supplied to an image process mechanism 43, which in turn forms an electronic image of sample W and detects, identifies and classifies defects of sample W for feedback to a manufacturing process management.

Figure 11:
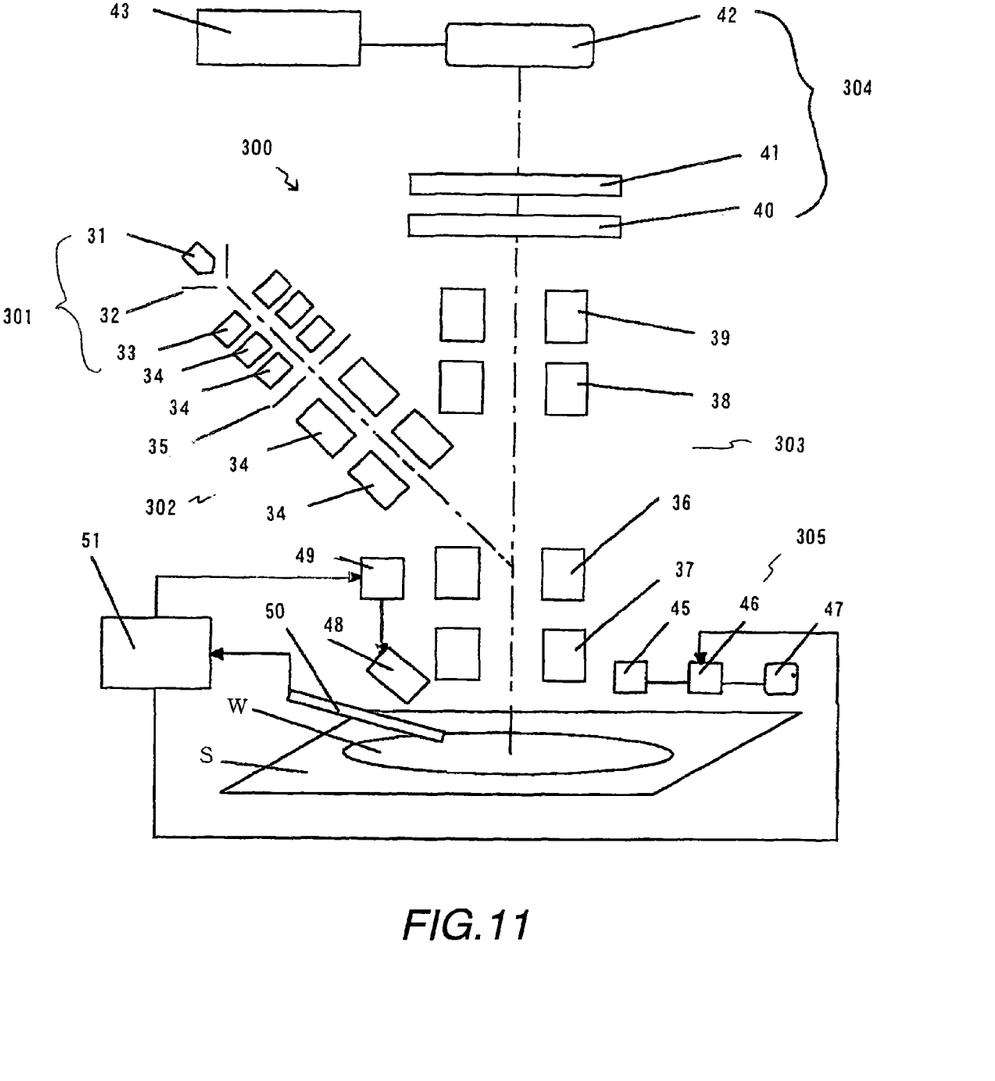
FIG. 11 is a diagram showing the third embodiment of a charged particle beam apparatus according to the present invention.
Figure 12:
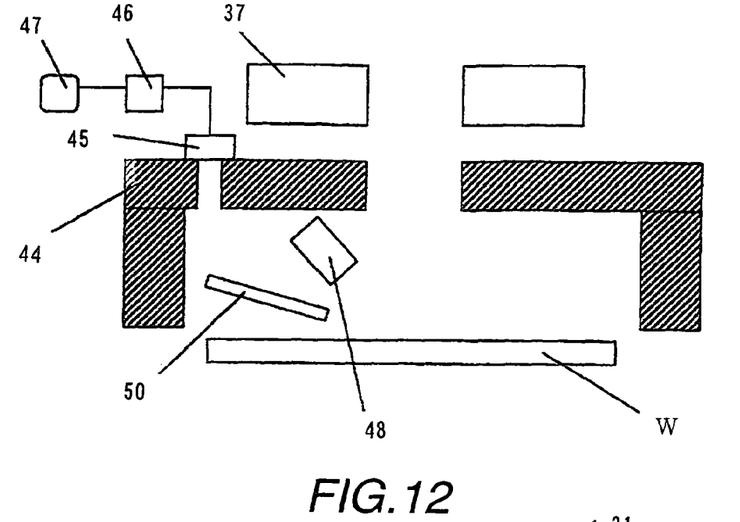
FIG. 12 is a diagram schematically showing an example of the structure of a gas introducing and laser intensity control mechanism shown in FIG. 11.

Further, charged particle beam apparatus 300 shown in FIG. 11 has charge-up eliminating means 305 for eliminating charge up of sample W. Charge-up eliminating means 305 is provided with a cover 44 to cover the whole sample placed on stage S, as shown in FIG. 12. A gas introducing part 45 is formed on cover 44 and is connected to a gas container 47 through a flow adjuster 46. In order to eliminate charge up uniformly in the whole sample, it is important to introduce a gas as uniformly as possible to the inside of cover 44. To this end, it is preferable that a plurality of (for example, eight) gas introducing parts 45 are provided around cover 44. As a gas supplied from gas container 47, $N_2$, He, Ar, dry air, $SF_6$, Xe, Ne, $X_2$, $H_2$, $O_2$ and the like can be used.

A light source 48 is mounted at an appropriate position inside of cover 44, and light emitted from light source 48 irradiates sample W. A light intensity adjuster 49 is provided to adjust the intensity of the light. As light source 48, either a laser source for emitting a laser beam or a light source lamp for emitting incoherent light can be used. A wavelength band of the laser beam and the incoherent light is preferably equal to or less than 300 nm-600 nm. An irradiation density of those types of light is preferably equal to 1 W/cm² or more. For example, He—Cd laser can be used as the laser source. In this case, the wavelength of the laser beam is preferably equal to 500 nm or less, and laser beams having two kinds of wavelength, 320 nm and 420 nm, are particularly preferable. An irradiation intensity is preferably equal to 2 W/cm² or less and, in particular, equal to 1 W/cm² or less and an irradiation area is preferably equal to 1 mm² or less. As other laser sources, laser diode, YAG, excimer laser, $TiAl_2O_3$ and the like can be used. A continuous irradiation method, a pulse irradiation method and the like can be used as a laser beam irradiation method.

It is noted that, although a single light source 48 is used in the embodiment shown in FIG. 11, it is useful to provide a plurality of light sources to enhance the light intensity. In this case, it is contemplated that a plurality of light sources may be positioned in symmetry with the central axis of sample W to irradiate sample W by a plurality of kinds of light from symmetrical directions so as to increase the irradiation efficiency.

Further, in order to perform electric potential measurement of an area where a surface of sample W is irradiated with the primary charged particle beam, a surface electrometer 50 is provided within cover 44. A introduced gas amount and light intensity control mechanism 51 calculates an amount of electrostatic charge on the surface of sample W from the potential measured by the surface electrometer, calculates an amount of gas to be introduced into cover 44 and the intensity of light emitted from light source 48 and supplies the calculated results to gas flow adjuster 46 and light intensity adjuster 49 to control them.

It is noted that an amount of charge on a surface of sample W can be calculated using the equation Q=C×V, where Q is an amount of charge [C], C is an electrostatic capacity [F] and V is a surface potential[V]. An electrostatic capacity between lines is determined at the time of circuit design.

To calculate an amount of introduced gas from an amount of electrostatic charge, it is possible to use, for example, the following equations:

$$G = P \times S_{\textit{eff}}$$

$$P = [(MT)^{1/2}/8.33 \times 10^{22}] \times [\eta Q/q\tau] \times 10^4$$

where G is an amount of introduced gas [L/sec], P is sample surface pressure [Pa], $S_{\textit{eff}}$ is differential discharge speed [L/sec], M is the number of molecules of the introduced gas, T is temperature [K], η is a probability of ionization, q is an elementary charge [c] and τ is a time constant of charge up [sec]. To calculate a laser intensity from an amount of charge, it is possible to use, for example, the following equations:

$$W = Vg \times Nm$$

$$Nm = (\eta \times Q)/q$$

where W is a laser intensity [w], Vg is the first ionization voltage of the introduced gas [V] and Nm is the number of molecules per unit volume of the introduced gas [/cm³].

Then, a gas is introduced from gas container 47 through gas introducing part 45 to the inside of cover 44. After the inside of cover 44 reaches a gas pressure corresponding to a preset value outputted from gas introduced amount and light intensity control mechanism 51, light source 48 is activated and starts illumination. Consequently, the intensity of light emitted from light source 48 corresponds to the preset value outputted from gas introduced amount and light intensity control mechanism 51. The gas irradiated by the light from light source 48 reaches the surface of sample W as an ionized gas. If a primary charged particle beam irradiates sample W in such a condition, a neutralization action of the gas ionized by the light works even if positive or negative charge up is generated on the surface of sample W. As a result, it is possible to cause the charge on the surface of sample W to be in an equilibrium state (that is, charge zero state). Further, by irradiating sample W directly with light, it is possible to increase the conductivity of the surface of sample W and to improve the uniformity of surface potential of a metal and an insulating material. Consequently, it is possible to obtain a satisfactory electric charge equilibrium state by a synergistic effect with the neutralization action of a gas for ionization. As a result, a satisfactory image without charge up and distortion can be obtained by using a charged particle beam apparatus having the structure shown in FIG. 11.

Figure 13:
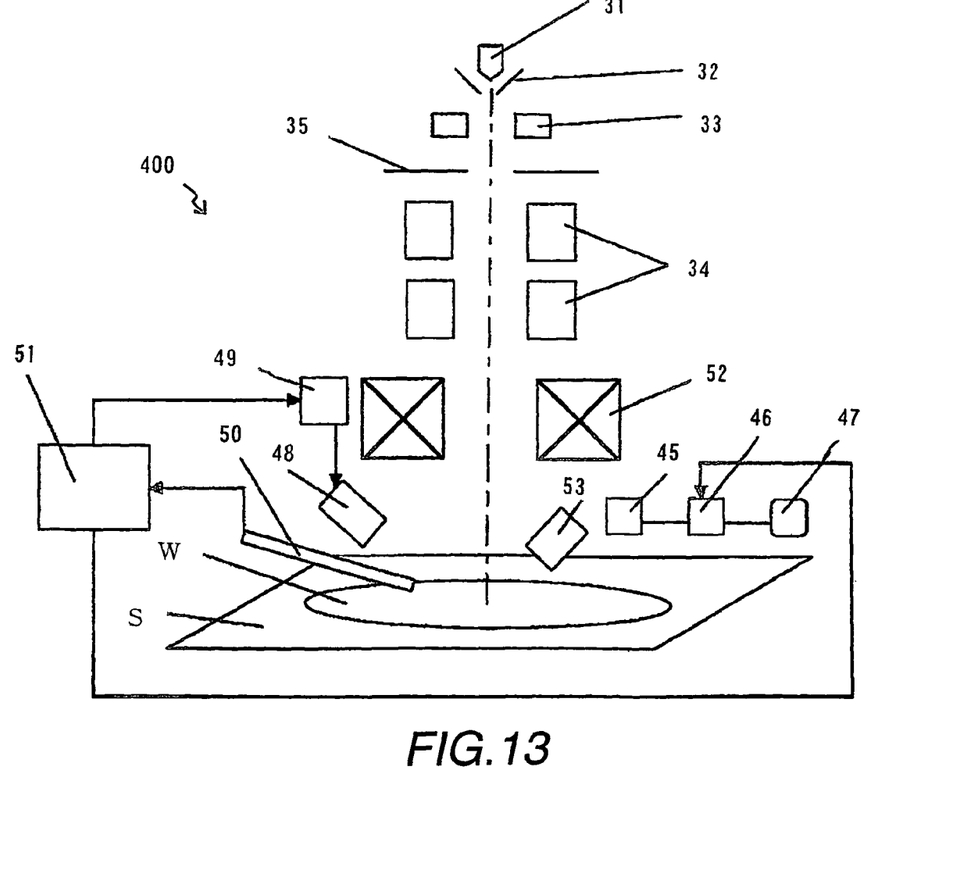
FIG. 13 is a diagram schematically showing the fourth embodiment of a charged particle beam apparatus according to the present invention.

FIG. 13 is a diagram schematically showing the structure of the fourth embodiment of a charged particle beam apparatus according to the present invention and the charged particle beam apparatus is embodied as a scanning-type charged particle beam apparatus 400. It is noted that the same or similar elements as shown in FIGS. 11 and 12 are designated by the same reference numerals in FIG. 13.

In FIG. 13, a primary charged particle beam emitted from a cathode 31 passes through a Wehnelt electrode 32 and is accelerated by an anode 33. The accelerated primary charged particle beam passes through an aperture 35 and scans a surface of a sample W at a desired magnification by an electrostatic lens 34 and a scanning coil 52. A secondary charged particles, such as secondary electrons, backscattered electrons and reflected electrons, emitted from sample W by the irradiation of the primary charged particle beam is detected by a detector 53 such as a photomal, thereby obtaining a two-dimensional image. Also in this embodiment, it is possible to obtain a satisfactory image without charge up and distortion by causing charge on a surface of sample W to be in an equilibrium state by using the means and methods described above with reference to FIGS. 11 and 12.

Hereafter, explanations will be made about examples of a charged particle beam apparatus 300, 400 according to the present invention. Example 1 is one regarding the third embodiment shown in FIG. 11. In the mapping-projection type charged particle beam apparatus 300 shown in FIG. 11, after the whole sample chamber (not shown) including sample W and stage S was discharged to such an extent as $1.0 \times 10^{-6}$ Pa, a nitrogen gas from gas container 47 was depressurized through a regulator (not shown) to such an extent as 0.1 Mpa, and was adjusted by flow adjuster 46 to 5 sccm. Then, the nitrogen gas was introduced from gas introducing part 45 to the inside of cover 44. By the gas introduction, the pressure within cover 44 reached about $1.0 \times 10^{-3}$ Pa. The portions which requires an operation environment to be at high vacuum, such as the primary electro-optical system column, the secondary electro-optical system column and the detecting system, were kept at such high vacuum as about $1.0 \times 10^{-5}$ Pa by a differential discharge mechanism.

Under such pressure conditions, after the intensity of the laser beam was set to a value capable of ionizing the nitrogen gas, the laser beam was irradiated near an area irradiated with the primary charged particle beam, and an image was obtained for observation and estimation of the sample surface. The nitrogen gas was ionized by the irradiation of the laser beam, and the neutralization action thereof caused the surface charge of sample S to approach to zero, resulting in an equilibrium state. As a result, a satisfactory image without charge up and image distortion was obtained in peripheral portions where image height was large and in areas of insulating materials.

In the charged particle beam apparatus 300 shown in FIG. 11, the above process was performed by introducing a halogenous gas, instead of Nitrogen in the above example, which has a stronger electron affinity than Nitrogen. Then, it was found that the time for causing the charge on the surface of sample W to reach the equilibrium state could be shortened and that test could make a throughput higher in the case of testing such a sample as a wafer.

The third and fourth embodiments of the present invention can bring about such advantages that, since an amount of electrostatic charge on a sample surface can be reduced or eliminated, a satisfactory image without distortion can be obtained, and, therefore, it is useful to apply those embodiments to mapping-projection type or scanning-type charged particle beam apparatuses.

Some embodiments of a charged particle beam apparatus according to the present invention have been described in detail, but the present invention should not be limited to those embodiments. Those skilled in the art could make various modifications and variations of the present invention without departing the scope of the claims.

What is claimed is:

1. A charged particle beam apparatus for observing and estimating a sample by irradiating the sample with a charged particle beam to detect secondary charged particles such as electrons emitted from the sample, reflected electrons and backscattered electrons, said apparatus comprising an electro optical system which includes astigmatism adjusting means having a multipole for adjusting astigmatism of the charged particle beam, wherein said astigmatism adjusting means is supplied with a correction voltage which maximizes a value for adjusting focus obtained from an image of a pattern formed on said sample; and wherein said astigmatism adjusting means is operable to:
   (a) obtain a first pattern image including lines formed longitudinally and transversely on the sample;
   (b) adjust said electro optical system to obtain a first auxiliary voltage when the visibility of the longitudinal and transversal lines of the image becomes maximum;
   (c) apply the first auxiliary voltage to said multipole to adjust a cross section of the electron beam;
   (d) adjust said electro optical system while maintaining the first auxiliary voltage when the longitudinal line can been seen clearly to obtain a second auxiliary voltage when the visibility of the transverse line in the image becomes maximum; and
   (e) apply the second auxiliary voltage to said multipole to adjust the cross section of the electron beam so that a difference between the visibilities of the longitudinal line and the transverse line becomes minimum.

2. A charged particle beam apparatus as claimed in claim 1, wherein said astigmatism adjusting means comprises a plurality of pairs of electrodes or coils opposing each other to place an optical axis of the charged particle beam at the center.

3. A charged particle beam apparatus as claimed in claim 2, wherein said astigmatism adjusting means has an electrode comprised of said multipole;
   wherein said electrode includes a first auxiliary electrode for adjusting a focus of longitudinal lines of a pattern formed on the sample and a second auxiliary electrode for adjusting a focus of lateral lines of the pattern formed on the sample; and
   wherein said astigmatism adjusting means adjusts a longitudinal line focus by adjusting a voltage of said first auxiliary electrode and adjusts a lateral line focus by adjusting a voltage of said second auxiliary electrode under a condition where a voltage applied when the longitudinal line focus has become the best is kept fixed.

4. A charged particle beam apparatus as claimed in claim 3, wherein said astigmatism adjusting means supplies a correction voltage which maximizes a value for adjusting focus obtained from an image of a second pattern having lines having a line width smaller than the lines of the pattern; and
   wherein said astigmatism adjusting means sets an average value of the best focus in the longitudinal direction and the best focus in the lateral direction as an initial value for focus adjustment of the second pattern.

5. A method of observing and estimating, in a charged particle beam apparatus, a sample by irradiating the sample with a charged particle beam to detect secondary charged particles such as electrons emitted from the sample, reflected electrons and backscattered electrons, in which said apparatus having an electro optical system which includes astigmatism adjusting means having a multipole for adjusting astigmatism of the charged particle beam, comprising:
   the step of obtaining a correction voltage which maximizes a value for adjusting focus obtained from an image of a pattern formed on said sample to adjust astigmatism of the charged particle beam,
   said method further comprising the steps of:
   (a) obtaining a first pattern image including lines formed longitudinally and transversely on the sample;
   (b) adjusting said electro optical system to obtain a fist auxiliary voltage when the visibility of the longitudinal and transversal lines of the image becomes maximum;
   (c) applying the first auxiliary voltage to said multipole to adjust a cross section of the electron beam;
   (d) adjusting said electro optical system while maintaining the first auxiliary voltage when the longitudinal line can be seen clearly to obtain a second auxiliary voltage when the visibility of the transverse line in the image becomes maximum;
   (e) applying the second auxiliary voltage to said multipole to adjust the cross section of the electron beam so that a difference between the visibilities of the longitudinal line and the transverse line becomes minimum; and
   (f) sequentially applying the steps (a)-(e) to patterns having narrower lines than the first pattern.

6. A method as claimed in claim 5, wherein the pattern includes lines and spaces, the lines being wiring lines formed longitudinally and laterally on the sample.

7. A method as claimed in claim 6, wherein the width of said lines is 250 nm-45 nm.

8. A method as claimed in claim 7, wherein astigmatism is adjusted using the lines or the spaces sequentially in a descending order of the size thereof.

9. A method as claimed in claim 8, wherein values for adjusting focus of the lines and the spaces are obtained in two different directions, and wherein a difference therebetween is used as an index to make the transition from one of the lines to the next line.

10. A method as claimed in claim 5, wherein a longitudinal line focus is adjusted by adjusting a first auxiliary voltage for adjusting a focus of longitudinal lines of an image of a pattern formed on the sample, and wherein a lateral line focus is adjusted by adjusting a second auxiliary voltage for adjusting the lateral line focus under a condition where a voltage applied when the longitudinal line focus becomes the best is kept fixed.

11. A method as claimed in claim 10, wherein a correction voltage which maximizes a focal value obtained from an image of a second pattern having lines having a line width smaller than the lines is obtained, and wherein an average value of the best focus in the longitudinal direction and the best focus in the lateral direction is set as an initial value for focus adjustment in the longitudinal direction of the second pattern.

12. A method as claimed in claim 11, wherein the method is automatically executed using an autofocus function.

13. A method as claimed in claim 12, wherein the sample is estimated in the midst of a process.

14. A charged particle beam apparatus, comprising:
means for directing a primary charged particle beam to a sample for irradiation;
means for guiding, to a detector, secondary charged particles having information about a surface of the sample and obtained by the irradiation of the primary charged particle beam directed to the sample;
means for combining the secondary charged particles guided to the detector as an image,
said apparatus further comprising:
measuring means for measuring an amount of charge on a surface of the sample; and
charge eliminating means for reducing or eliminating the amount of charge on the surface of the sample on the basis of the amount of charge measured by the measurement means.

15. A charged particle beam apparatus as claimed in claim 14, wherein a current density of the primary charged particle beam is set to be equal to or less than 10 A/cm$^2$.

16. A charged particle beam apparatus as claimed in claim 14, wherein energy of the primary charged particle beam is set to be equal to or more than 1 eV and less than 20 keV.

17. A charged particle beam apparatus as claimed in claim 14, wherein the measuring means has means for measuring an electric potential of an area in the surface of the sample irradiated by the primary charged particle beam.

18. A charged particle beam apparatus as claimed in claim 14, wherein the charge eliminating means comprises:
a light source for irradiating the sample; and
gas supplying means for supplying a gas to cover the surface of the sample uniformly.

19. A charged particle beam apparatus as claimed in claim 18, wherein the light source is either a laser source or a light source lamp, and wherein a wavelength band of a laser beam from the laser source or incoherent light from the light source lamp is equal to or less than 300 nm-600 nm.

20. A charged particle beam apparatus as claimed in claim 19, wherein an irradiation density of the laser beam or the incoherent light is equal to or more than 1 W/cm$^2$.

21. A charged particle beam apparatus as claimed in claim 18, further comprising a stage for placing the sample thereon, wherein the gas supplying means includes a cover having at least one gas introducing part and covering the sample placed on the stage.

22. A charged particle beam apparatus as claimed in claim 21, wherein gas pressure within a space covered by the cover is 0.0001-0.1 Pa.

23. A charged particle beam apparatus as claimed in claim 18, wherein the gas is either one of Nitrogen, water vapor, a halogenous gas having high electron affinity and a combination thereof.

24. A charged particle beam apparatus as claimed in claim 18, wherein the charge eliminating means further comprises a mechanism for controlling an amount of gas supplied by the gas supplying means and the intensity of light emitted from the light source on the basis of the output of the measuring means.

25. A charged particle beam apparatus as claimed in claim 14, wherein the charge eliminating means obtains an amount of charge Q[c] of the sample, using the equation Q=C×V on the basis of an electrostatic capacity C[F] between wiring lines of the sample and a surface potential[V] of the sample measured by the measuring means.

26. A charged particle beam apparatus as claimed in claim 18, wherein the charge eliminating means obtains an amount of charge Q[c] of the sample, using the equation Q=C×V on the basis of an electrostatic capacity C[F] between wiring lines of the sample and a surface potential[V] of the sample measured by the measuring means, and
wherein the charge eliminating means calculates an amount of the introduced gas on the basis of the amount of charge, the amount of molecules of the introduced gas, temperature, a probability of ionization of the introduced gas, an elementary charge, a time constant of charge up and differential discharge speed of the cover.

27. A charged particle beam apparatus as claimed in claim 19, wherein the charge eliminating means calculates an intensity of the light source on the basis of the amount of charge, a probability of ionization of the introduced gas, an elementary charge and a first ionizing voltage of the introduced gas.

28. A semiconductor manufacturing method characterized by inspecting a wafer in the midst of processing, using a charged particle beam apparatus as claimed in claim 14.

* * * * *